United States Patent
Sekiya

(10) Patent No.: US 10,403,490 B2
(45) Date of Patent: Sep. 3, 2019

(54) WAFER PROCESSING METHOD

(71) Applicant: DISCO CORPORATION, Tokyo (JP)

(72) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/977,418

(22) Filed: May 11, 2018

(65) Prior Publication Data
US 2018/0330938 A1  Nov. 15, 2018

(30) Foreign Application Priority Data
May 11, 2017  (JP) .................. 2017-094916

(51) Int. Cl.
H01L 21/02 (2006.01)
H01L 21/683 (2006.01)
H01L 21/67 (2006.01)
B24B 7/22 (2006.01)

(52) U.S. Cl.
CPC ........ *H01L 21/02013* (2013.01); *B24B 7/228* (2013.01); *H01L 21/02016* (2013.01); *H01L 21/67092* (2013.01); *H01L 21/67132* (2013.01); *H01L 21/6836* (2013.01); *H01L 21/6838* (2013.01); *H01L 2221/6834* (2013.01); *H01L 2221/68327* (2013.01); *H01L 2221/68386* (2013.01)

(58) Field of Classification Search
CPC ......... H01L 21/02013; H01L 21/02016; H01L 21/67092
USPC .......................................... 438/459–463, 959
See application file for complete search history.

(56) References Cited

U.S. PATENT DOCUMENTS

| 5,927,993 | A  * | 7/1999 | Lesk ...................... H01L 21/78 257/E21.599 |
| 7,507,638 | B2 * | 3/2009 | Mancini .............. H01L 21/3065 257/E21.214 |
| 2006/0183349 | A1 * | 8/2006 | Farnworth .......... H01L 21/3043 438/792 |
| 2009/0124063 | A1 * | 5/2009 | Nakamura ........... B23K 26/009 438/463 |
| 2011/0193203 | A1 * | 8/2011 | Goto ................... H01L 23/5389 257/659 |
| 2012/0003816 | A1 * | 1/2012 | Shimotani ............... H01L 21/78 438/462 |
| 2013/0049205 | A1 * | 2/2013 | Meyer ................. H01L 23/3107 257/773 |

(Continued)

FOREIGN PATENT DOCUMENTS

JP           10050642 A      2/1998

*Primary Examiner* — Sheikh Maruf
(74) *Attorney, Agent, or Firm* — Greer Burns & Crain, Ltd.

(57) ABSTRACT

A wafer processing method includes a close contact making step of pressing a protective film against the front side of a wafer in a radially outward direction starting from the center of the wafer to thereby bring the protective film into close contact with the front side of the wafer, a protective member fixing step of covering the protective film with a protective member formed by curing a liquid resin to thereby fix the protective member through the protective film to the front side of the wafer, a grinding step of grinding the back side of the wafer to reduce the thickness of the wafer, and a peeling step of peeling the protective film and the protective member from the wafer thinned by the grinding step.

8 Claims, 10 Drawing Sheets

(56) References Cited

U.S. PATENT DOCUMENTS

| | | | |
|---|---|---|---|
| 2014/0017880 A1* | 1/2014 | Lei | H01L 21/78 438/462 |
| 2015/0093880 A1* | 4/2015 | Ji | H01L 21/02013 438/459 |
| 2015/0332909 A1* | 11/2015 | Suzuki | B24B 1/00 438/691 |
| 2017/0243733 A1* | 8/2017 | Chen | H01L 21/02013 |
| 2018/0033739 A1* | 2/2018 | Seddon | H01L 21/304 |

* cited by examiner

WAFER PROCESSING METHOD

BACKGROUND OF THE INVENTION

Field of the Invention

The present invention relates to a wafer processing method for use in grinding a wafer having asperities formed on the front side.

Description of the Related Art

There is an increasing chance of thinning a wafer before dividing the wafer into device chips, so as to reduce the size and weight of each device chip adapted to be incorporated into various electronic equipment or the like. For example, the wafer can be thinned by holding the front side of the wafer on which devices are formed on a chuck table, rotating a grinding wheel, and pressing the grinding wheel against the back side of the wafer to thereby grind the back side of the wafer.

In grinding the wafer by using the above method, a protective member is usually attached to the front side of the wafer (see Japanese Patent Laid-Open No. Hei 10-50642, for example). The protective member can prevent the possibility that the devices formed on the front side of the wafer may be damaged by a force applied to the wafer in grinding the wafer. Examples of the protective member include an adhesive tape formed of resin and a substrate having high hardness.

SUMMARY OF THE INVENTION

In many cases, asperities such as bumps functioning as electrodes on each device are formed on the front side of the wafer. However, when such asperities are present on the front side of the wafer, there arises a problem such that a height difference due to the asperities cannot be sufficiently absorbed by an adhesive tape and the shape corresponding to each asperity may appear on the back side of the wafer after grinding.

By using a substrate having high hardness as the protective member, the above problem can be almost eliminated. However, this substrate is bonded to the wafer by using an adhesive such as a thermoplastic wax. Accordingly, in peeling the substrate from the wafer after grinding, it is necessary to conduct any extensive work dedicated to peeling, such as immersion of the wafer in a solution or heating of the wafer at high temperatures.

It is therefore an object of the present invention to provide a wafer processing method which can sufficiently suppress the influence of the asperities present on the front side of the wafer in grinding the back side of the wafer and can simply perform a peeling operation after grinding.

In accordance with an aspect of the present invention, there is provided a wafer processing method including a close contact making step of opposing a protective film to the front side of a wafer on which a central device area and a peripheral marginal area surrounding the device area are formed, a plurality of devices each having asperities being formed in the device area, and next pressing the protective film against the front side of the wafer in a radially outward direction starting from the center of the wafer to thereby bring the protective film into close contact with the front side of the wafer so as to follow the asperities of each device formed on the front side of the wafer; a protective member fixing step of covering the protective film with a protective member formed from a liquid resin curable by external stimulus after performing the close contact making step, thereby fixing the protective member through the protective film to the front side of the wafer; a grinding step of holding the protective member fixed to the wafer on a holding surface of a chuck table in the condition where the back side of the wafer is exposed after performing the protective member fixing step, and next grinding the back side of the wafer to thereby reduce the thickness of the wafer; and a peeling step of peeling the protective member and the protective film from the wafer after performing the grinding step.

Preferably, the protective film has a first surface and a second surface opposite to the first surface, the first surface being opposed to the wafer; the close contact making step including the step of discharging a gas toward the second surface of the protective film to thereby press the protective film against the front side of the wafer.

Preferably, the gas includes a heated gas.

Preferably, the close contact making step includes the step of heating the protective film to thereby soften the protective film in pressing the protective film against the front side of the wafer.

Preferably, the protective member fixing step includes the steps of applying the liquid resin to a flat sheet, next pressing the wafer against the liquid resin through the protective film to thereby fully cover the protective film with the liquid resin, and next applying the external stimulus to the liquid resin to thereby cure the liquid resin, thereby forming the protective member from the liquid resin and fixing the protective member to the wafer.

Preferably, the close contact making step includes the steps of pressing the protective film against the front side of the wafer under vacuum and next applying an atmospheric pressure to the protective film to thereby bring the protective film into close contact with the front side of the wafer so as to follow the asperities.

Preferably, the wafer processing method further includes a liquid supplying step of supplying a liquid to the front side of the wafer before performing the close contact making step; the close contact making step including the step of pressing the protective film against the front side of the wafer with the liquid interposed therebetween.

Preferably, the peeling step includes the step of vaporizing the liquid left between the protective film and the front side of the wafer.

In the wafer processing method according to the present invention, the protective film is first brought into close contact with the front side of the wafer on which the devices each having asperities are formed in such a manner as to follow the asperities. Thereafter, the protective film is covered with the protective member formed from the liquid resin curable by external stimulus, thereby fixing the protective member through the protective film to the front side of the wafer. Accordingly, by forming the protective member having a suitable thickness, the asperities formed on the front side of the wafer can be sufficiently absorbed.

In the wafer processing method according to the present invention, the protective film is not bonded to the device area of the wafer, but is merely in close contact with the device area. Accordingly, the protective member and the protective film can be simply peeled from the wafer without the need for any extensive work dedicated to peeling, such as immersion of the wafer in a solution or heating of the wafer at high temperatures. Thus, according to the present invention, it is possible to provide a wafer processing method which can exhibit the effects that the influence of the asperities present on the front side of the wafer can be sufficiently suppressed in grinding the back side of the wafer and that the peeling operation after grinding can also be simply performed.

Further, in the wafer processing method according to the present invention, the protective film is pressed against the front side of the wafer in a radially outward direction starting from the center of the wafer in the close contact making step. Accordingly, it is possible to prevent that air may be left between the wafer and the protective film, thereby reliably bringing the protective film into close contact with the front side of the wafer. As a result, although the protective film does not have adhesion by an adhesive (paste), there is no possibility that the protective film and the protective member may be peeled from the wafer in grinding the wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described with reference to the attached drawings. The wafer processing method according to this preferred embodiment includes a close contact making step (see FIGS. 1A, 1B, 2A, 2B, 3A, and 3B), a protective member fixing step (see FIGS. 4A, 4B, and 4C), a grinding step (see FIGS. 5A and 5B), and a peeling step (see FIG. 6). In the close contact making step, a protective film not having adhesion by an adhesive (paste) is brought into close contact with the front side of a wafer so as to follow asperities formed on the front side of the wafer. In the protective member fixing step, the protective film is covered with a protective member formed from a liquid resin to thereby fix the protective member through the protective film to the front side of the wafer. In the grinding step, the back side of the wafer is ground in the condition where the protective member fixed through the protective film to the front side of the wafer is held on a holding surface of a chuck table. In the peeling step, the protective member and the protective film are peeled together from the wafer thinned by the grinding step. The wafer processing method according to this preferred embodiment will now be described in more detail.

Figure 1A:
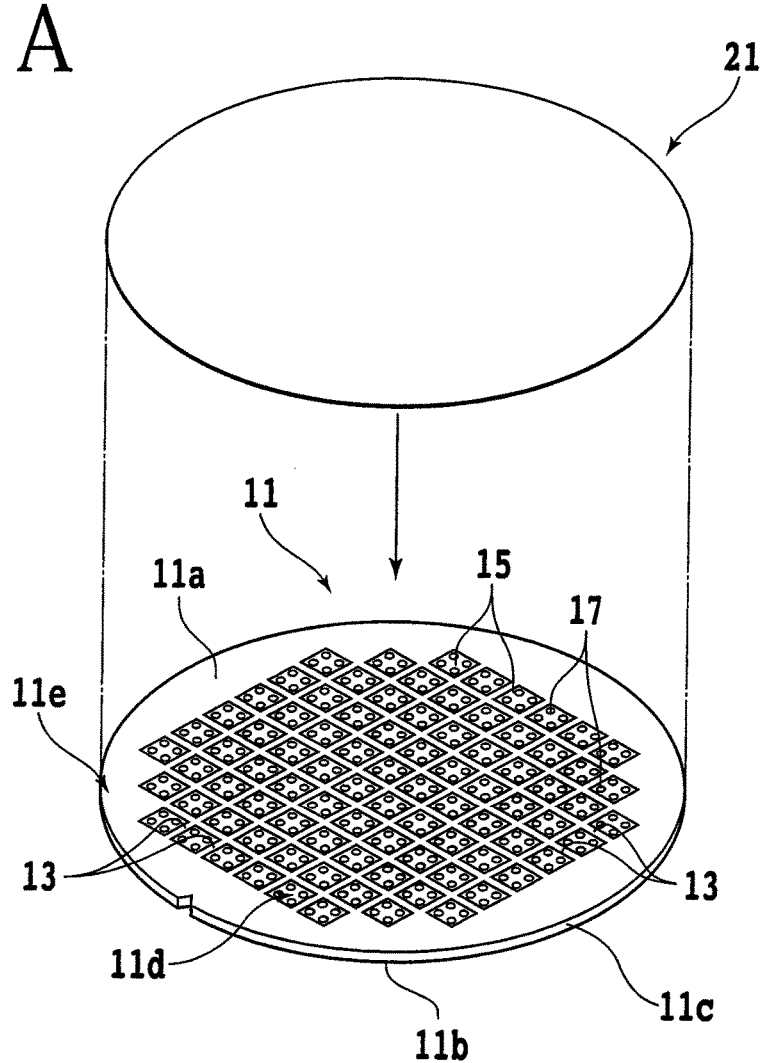
FIG. 1A is a schematic perspective view showing a manner of opposing a protective film to the front side of a wafer.
Figure 1B:
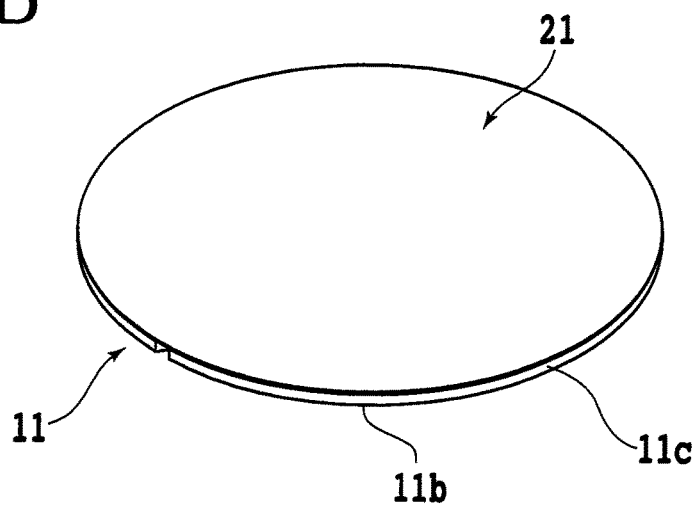
FIG. 1B is a schematic perspective view showing a condition where the protective film is in close contact with the front side of the wafer.
Figure 2A:
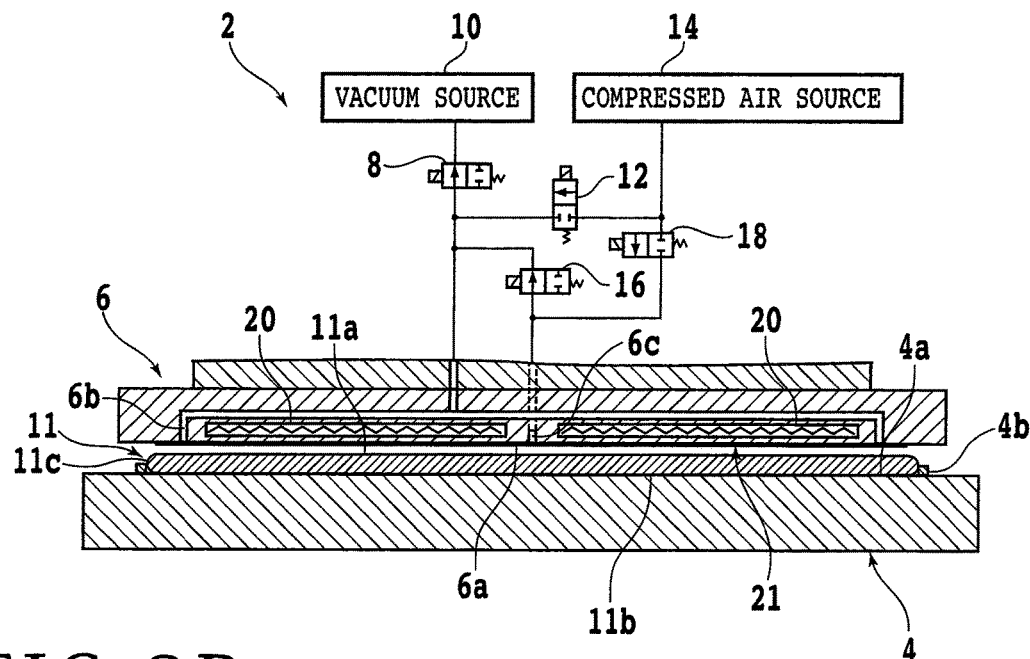
FIG. 2A is a schematic sectional view showing a condition where the protective film is opposed to the front side of the wafer in a close contact making step according to a preferred embodiment.
Figure 2B:
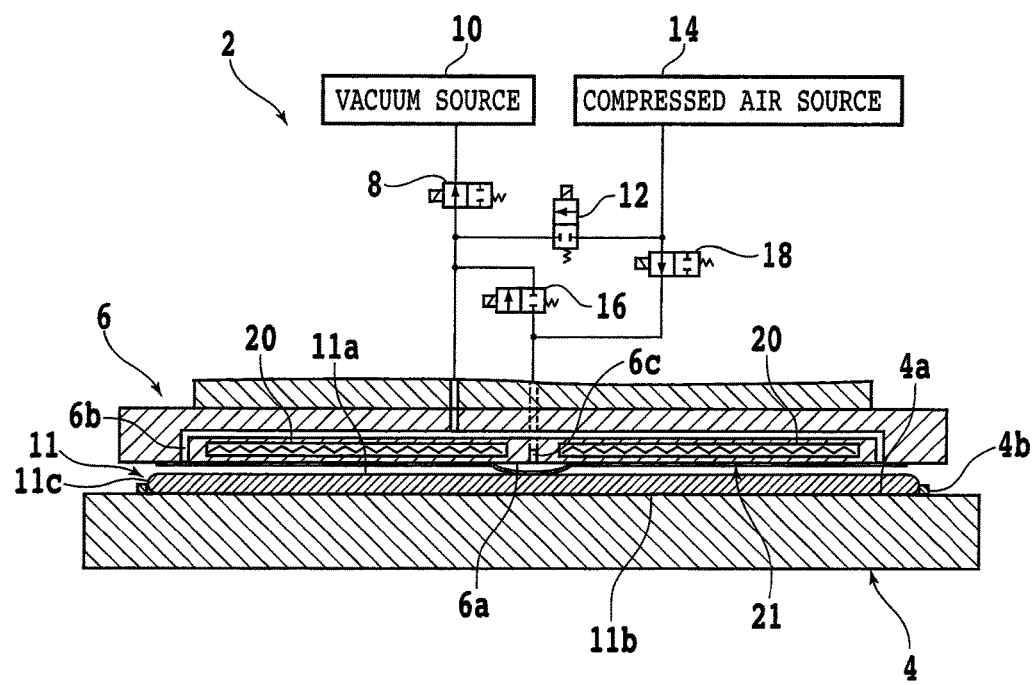
FIG. 2B is a schematic sectional view showing a manner of bringing the protective film into close contact with the front side of the wafer in the close contact making step.
Figure 3A:
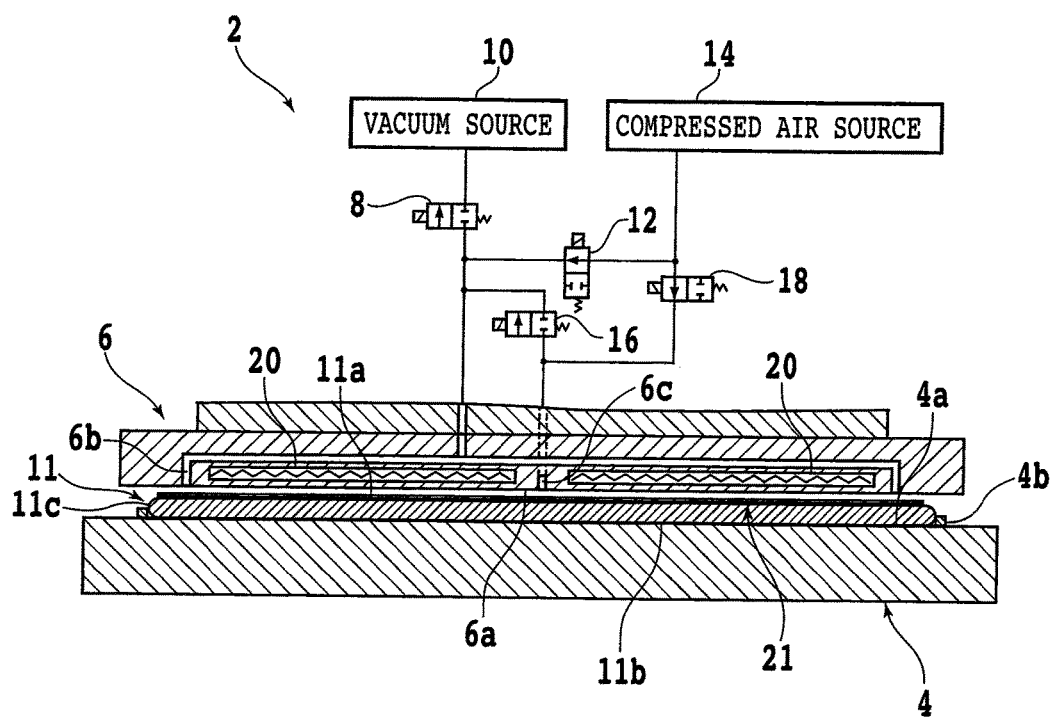
FIG. 3A is a schematic sectional view showing a condition where the protective film has been brought into close contact with the front side of the wafer.
Figure 3B:
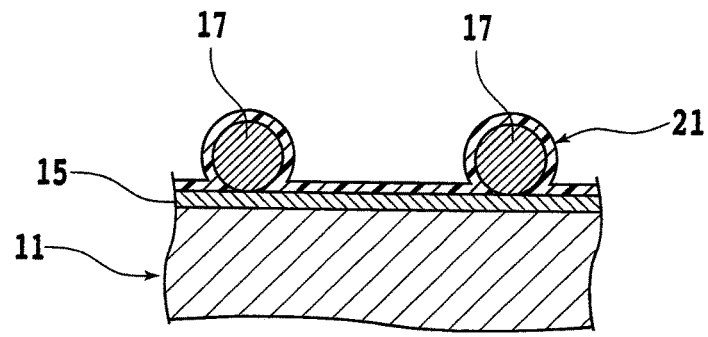
FIG. 3B is an enlarged sectional view of a part of the wafer in the condition where the protective film is in close contact with the front side of the wafer.

In the wafer processing method according to this preferred embodiment, the close contact making step is first performed to bring a protective film not having adhesion by an adhesive into close contact with the front side of a wafer so as to follow asperities formed on the front side of the wafer. More specifically, the protective film having no adhesive is first opposed to the front side of the wafer. In this condition, the protective film is pressed against the front side of the wafer in a radially outward direction starting from the center of the wafer, thereby bringing the protective film into close contact with the front side of the wafer. FIG. 1A is a schematic perspective view showing a manner of opposing the protective film to the front side of the wafer, and FIG. 1B is a schematic perspective view showing a condition where the protective film is in close contact with the front side of the wafer. FIG. 2A is a schematic sectional view showing a condition where the protective film is opposed to the front side of the wafer, and FIG. 2B is a schematic sectional view showing a manner of bringing the protective film into close contact with the front side of the wafer. FIG. 3A is a schematic sectional view showing a condition where the protective film has been brought into close contact with the front side of the wafer, and FIG. 3B is an enlarged sectional view of a part of the wafer in the condition where the protective film is in close contact with the front side of the wafer. In FIGS. 2A, 2B, and 3A, a part of the components is shown by functional blocks.

Referring to FIG. 1A, a wafer 11 to be used in this preferred embodiment is shown. The wafer 11 is a disk-shaped wafer formed of silicon (Si), for example. The wafer 11 has a front side 11a, a back side 11b, and an outer circumference 11c. The outer circumference 11c is chamfered along the edges both on the front side 11a and on the back side 11b. The front side 11a of the wafer 11 is composed of a central device area 11d and a peripheral marginal area 11e surrounding the device area 11d. The device area 11d is partitioned by a plurality of crossing division lines (streets) 13 to thereby define a plurality of separate regions where a plurality of devices 15 such as ICs (integrated circuits) are individually formed. Further, a plurality of bumps (asperities) 17 functioning as electrodes are provided on the front side of each device 15. Each bump 17 is formed of solder, for example. While the wafer 11 is a disk-shaped wafer formed of silicon, for example, in this preferred embodiment, the wafer 11 is not limited in material, shape, structure, size, etc. That is, the wafer 11 may be a wafer formed of any other semiconductors, ceramic, resin, metal, etc. Similarly, the devices 15 and the bumps 17 are not limited in kind, number, shape, structure, size, layout, etc. The bumps 17 may be replaced by any structures (asperities) having any other functions. That is, the bumps 17 may not be formed on the front side 11a of the wafer 11, but any other asperities may be formed on the front side 11a of the wafer 11.

In the close contact making step according to this preferred embodiment, a protective film 21 is brought into close contact with the front side 11a of the wafer 11 as shown in FIGS. 1A and 1B. The protective film 21 is a flexible film formed of resin, for example. The protective film 21 is a circular member having a diameter substantially equal to that of the wafer 11. Further, the protective film 21 is not provided with an adhesive. The thickness of the protective film 21 is not especially limited. For example, the thickness of the protective film 21 is preferably set to approximately 30 μm to 150 μm.

The close contact making step may be performed by using a close contact making apparatus 2 shown in FIG. 2A. The close contact making apparatus 2 includes a support table 4 for supporting the wafer 11. The support table 4 has a substantially flat upper surface, which functions as a support surface 4a for supporting the wafer 11. The support surface 4a is provided with a projecting guide portion 4b for positioning the wafer 11 on the support surface 4a. There is provided above the support table 4 a protective film holding unit 6 for holding the protective film 21 under suction and bringing it into close contact with the wafer 11. The protective film holding unit 6 has a substantially flat lower surface, which functions as a holding surface 6a for holding the protective film 21 under suction. The protective film holding unit 6 is vertically movably supported by a moving mechanism (not shown), so that the protective film holding unit 6 holding the protective film 21 under suction can be moved in a vertical direction by operating this moving mechanism.

A first passage 6b is formed inside the protective film holding unit 6, and one end of the first passage 6b opens to the holding surface 6a in a peripheral area for holding the peripheral portion of the protective film 21. The other end of the first passage 6b is branched into a plurality of portions, more specifically, a first branch portion, a second branch portion, and a third branch portion. A vacuum source 10 is connected through a valve 8 to the first branch portion of the first passage 6b. A compressed air source 14 is connected through a valve 12 to the second branch portion of the first passage 6b. Further, a second passage 6c is also formed inside the protective film holding unit 6, and one end of the second passage 6c opens to the holding surface 6a in a central area for holding the central portion of the protective film 21. The other end of the second passage 6c is also branched into a plurality of portions, more specifically, a first branch portion and a second branch portion. The first branch portion of the second passage 6c is connected through a valve 16 to the third branch portion of the first passage 6b. The compressed air source 14 is connected through a valve 18 to the second branch portion of the second passage 6c. Further, a heater 20 for heating the holding surface 6a is provided inside the protective film holding unit 6.

In the close contact making step, the wafer 11 is first placed on the support table 4 in the condition where the back side 11b of the wafer 11 is in contact with the support surface 4a of the support table 4 as shown in FIG. 2A. Accordingly, the wafer 11 is supported on the support table 4 in the condition where the front side 11a of the wafer 11 is exposed upward. Thereafter, the protective film 21 is brought into contact with the holding surface 6a of the protective film holding unit 6 so as to be aligned with the wafer 11. More specifically, the outer circumference of the protective film 21 is positioned directly above the outer circumference 11c of the wafer 11. In this condition, the valves 8 and 16 are opened to apply a vacuum generated from the vacuum source 10 to the protective film 21. Accordingly, the protective film 21 is held on the holding surface 6a of the protective film holding unit 6 under suction so as to be opposed to the front side 11a of the wafer 11. Before opening the valves 8 and 16, the valves 12 and 18 are closed to stop the supply of compressed air (gas) from the compressed air source 14 to the first passage 6b and the second passage 6c. The vertical position of the protective film holding unit 6 is adjusted so that the spacing between the front side 11a of the wafer 11 and the protective film 21 becomes approximately 0.1 to 10 mm, for example.

After opposing the protective film 21 to the front side 11a of the wafer 11, the holding surface 6a is heated by the heater 20 to thereby apply heat to the protective film 21, thereby softening the protective film 21. Thereafter, as shown in FIG. 2B, the valve 16 is closed to cut off the vacuum from the vacuum source 10 to the second passage 6c, and the valve 18 is next opened to supply the compressed air from the compressed air source 14 to the second passage 6c. Accordingly, the compressed air is discharged toward the central portion of the upper surface of the protective film 21, in which the central portion of the upper surface of the protective film 21 is merely in contact with the holding surface 6a at this time (the upper surface of the protective film 21 corresponds to the second surface opposite to the first surface of the protective film 21 opposed to the wafer 11). As a result, the central portion of the protective film 21 is swelled downward and pressed against the front side 11a of the wafer 11 as shown in FIG. 2B. Thereafter, the discharge of the compressed air toward the protective film 21 is continued, so that the protective film 21 is pressed against the front side 11a of the wafer 11 in a radially outward direction starting from the center of the wafer 11.

After pressing the protective film 21 against the front side 11a of the wafer 11 in the whole area except the peripheral area yet held under suction, the valve 8 is closed to cut off the vacuum from the vacuum source 10 to the first passage 6b, and the valve 12 is next opened to supply the compressed air from the compressed air source 14 to the first passage 6b as shown in FIG. 3A. Accordingly, the compressed air is also discharged toward the peripheral portion of the upper surface of the protective film 21, so that the peripheral portion of the protective film 21 is also pressed against the front side 11a of the wafer 11. As a result, as shown in FIGS. 1B, 3A, and 3B, the protective film 21 can be brought into close contact with the front side 11a of the wafer 11 so as to follow the shape of each bump 17 formed on the front side 11a of the wafer 11. In this preferred embodiment, the protective film 21 is heated to be softened by the heater 20. Accordingly, the protective film 21 can be brought into close contact with the front side 11a of the wafer 11 so as to be properly fitted to each bump 17.

Figure 4A:
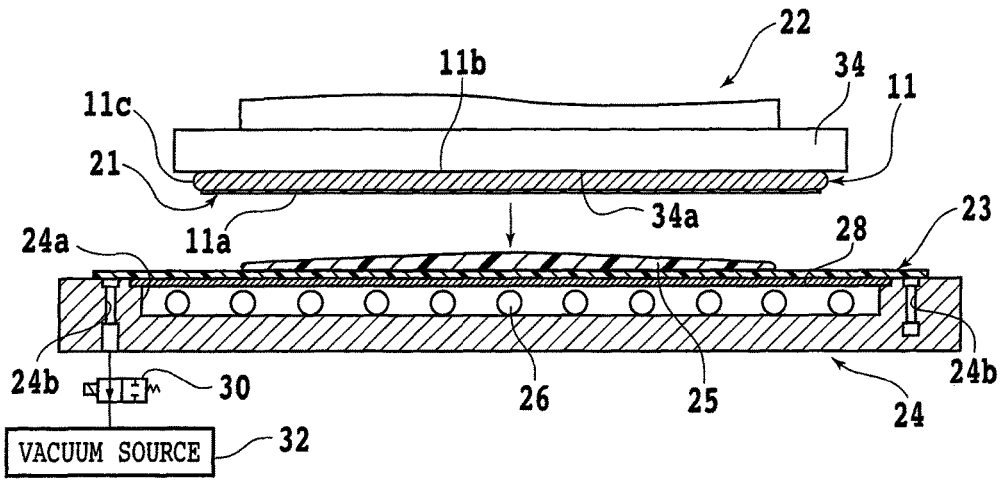
FIG. 4A is a schematic sectional view showing a manner of pressing the wafer through the protective film against a liquid resin applied to a sheet in a protective member fixing step according to this preferred embodiment.
Figure 4B:
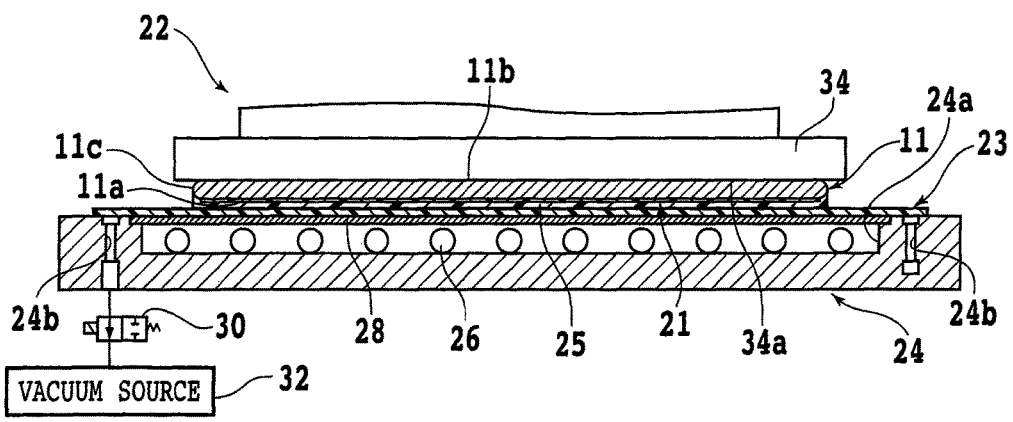
FIG. 4B is a schematic sectional view showing a manner of curing the liquid resin to thereby form a protective member, thereby fixing the protective member through the protective film to the front side of the wafer in the protective member fixing step.
Figure 4C:
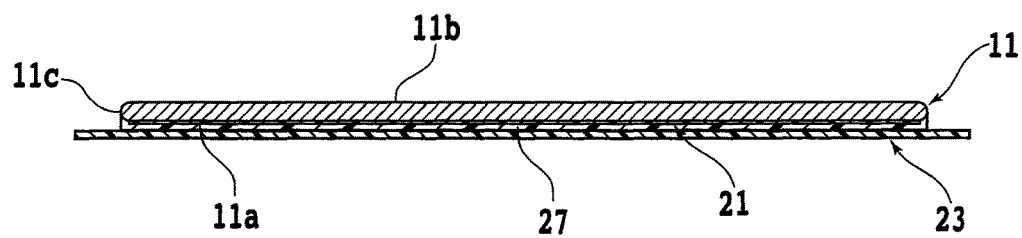
FIG. 4C is a schematic sectional view showing the wafer in the condition where the protective member supported to the sheet is fixed through the protective film to the front side of the wafer.

After performing the close contact making step, the protective member fixing step is performed to cover the protective film 21 with a protective member formed from a liquid resin, thereby fixing the protective member through the protective film 21 to the front side 11a of the wafer 11. FIG. 4A is a schematic sectional view showing a manner of pressing the wafer 11 through the protective film 21 against a liquid resin applied to a sheet, FIG. 4B is a schematic sectional view showing a manner of curing the liquid resin to thereby form the protective member, thereby fixing the protective member through the protective film 21 to the front side 11a of the wafer 11, and FIG. 4C is a schematic sectional view showing the wafer 11 in the condition where the protective member supported to the sheet is fixed through the protective film 21 to the front side 11a of the wafer 11. In FIGS. 4A and 4B, a part of the components is shown by functional blocks.

The protective member fixing step may be performed by using a protective member fixing apparatus 22 shown in FIGS. 4A and 4B. The protective member fixing apparatus 22 includes a holding table 24 for holding a substantially flat sheet (carrier sheet) 23 formed of resin, for example. The holding table 24 has an upper surface formed with a central circular recess 24a larger in diameter than the wafer 11. An ultraviolet light source 26 is provided in the recess 24a. The upper end opening of the recess 24a is covered with a plate 28 capable of transmitting at least a part of ultraviolet light applied from the ultraviolet light source 26. The sheet 23 is supported at its central portion by the plate 28. A suction passage 24b is formed inside the holding table 24 in a peripheral area surrounding the recess 24a, and one end of the suction passage 24b opens to the upper surface of the holding table 24 in this peripheral area, so as to hold a peripheral portion of the sheet 23 under suction.

The other end of the suction passage 24b is connected through a valve 30 to a vacuum source 32. Accordingly, by applying a vacuum generated from the vacuum source 32 through the suction passage 24b to the peripheral portion of the sheet 23, the sheet 23 can be held on the holding table 24 under suction. There is provided above the holding table 24 a wafer holding unit 34 for holding the wafer 11. The wafer holding unit 34 has a lower surface 34a for holding the wafer 11. The wafer holding unit 34 is vertically movably supported by a moving mechanism (not shown), so that the wafer holding unit 34 holding the wafer 11 can be moved in a vertical direction by operating this moving mechanism. The wafer holding unit 34 may be a vacuum suction type such that a vacuum is used to hold the wafer 11 under suction or may be of an electrostatic attraction type such that an electrostatic force is used to hold the wafer 11.

In the protective member fixing step, a liquid resin 25 is previously applied to the upper surface of the sheet 23 as shown in FIG. 4A, and the lower surface of the sheet 23 is held on the holding table 24. Further, the back side 11b of the wafer 11 is held on the lower surface 34a of the wafer holding unit 34. Accordingly, the protective film 21 kept in close contact with the front side 11a of the wafer 11 is opposed to the liquid resin 25 applied to the sheet 23. The liquid resin 25 is a liquid resin curable by the ultraviolet light applied from the ultraviolet light source 26. For example, TEMPLOC (registered trademark) manufactured by Denka Co., Ltd. may be used as the liquid resin 25. While the sheet 23 is held on the holding table 24 in the condition where the liquid resin 25 is previously applied to the upper surface of the sheet 23 in this preferred embodiment, the sheet 23 only may be first held on the holding table 24, and the liquid resin 25 may be next applied to the upper surface of the sheet 23. As shown in FIG. 4A, the liquid resin 25 is not completely flat on the sheet 23, but the central portion of the liquid resin 25 is preferably slightly raised.

Thereafter, as shown in FIG. 4B, the wafer holding unit 34 is lowered to press the front side 11a of the wafer 11 through the protective film 21 against the liquid resin 25. As a result, the liquid resin 25 is spread in the radial direction of the wafer 11 so as to fully cover the protective film 21. In this preferred embodiment, the amount of the liquid resin 25 to be applied and the amount of lowering of the wafer holding unit 34 are adjusted so that the whole of the front side 11a of the wafer 11 is covered with the liquid resin 25. Thereafter, ultraviolet light is applied from the ultraviolet light source 26 toward the liquid resin 25 to thereby cure the liquid resin 25. Accordingly, as shown in FIG. 4C, the liquid resin 25 is formed into a protective member 27 fully covering the protective film 21, and this protective member 27 is fixed to the front side 11a of the wafer 11. Thusly, the protective film 21 on the front side 11a of the wafer 11 is fully covered with the protective member 27 formed from the liquid resin 25, thereby fixing the protective member 27 through the protective film 21 to the front side 11a of the wafer 11. Further, the sheet 23 is fixed to the protective member 27.

Figure 5A:
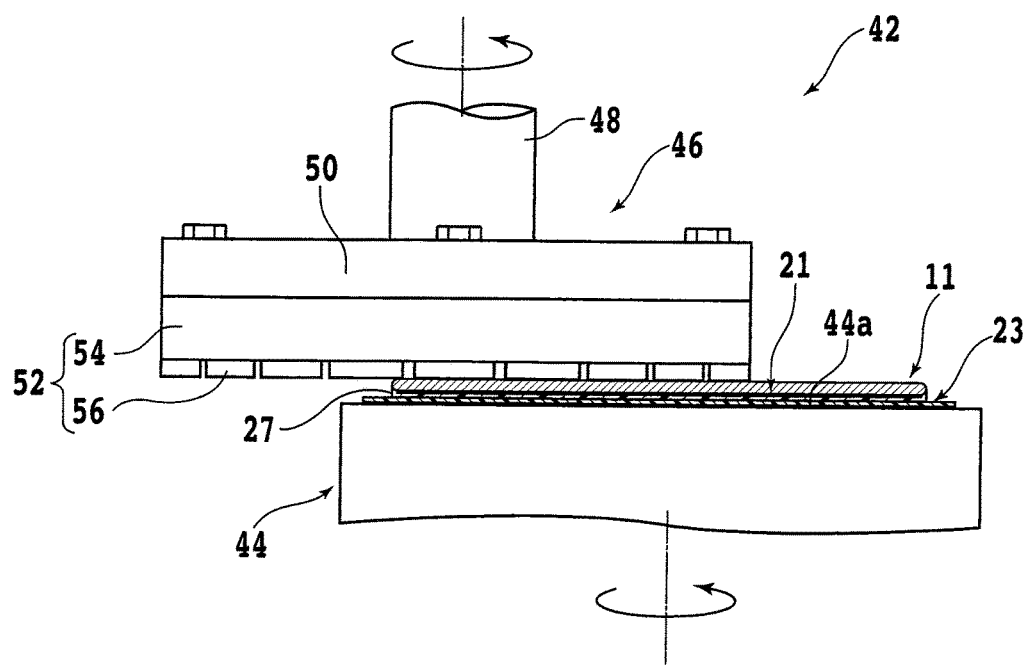
FIG. 5A is a schematic side view, partially in cross section, showing a manner of grinding the back side of the wafer in a grinding step according to this preferred embodiment.
Figure 5B:
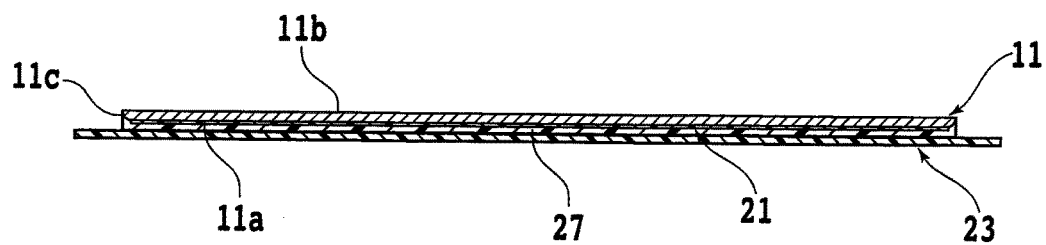
FIG. 5B is a schematic sectional view of the wafer processed by the grinding step.

After performing the protective member fixing step, the grinding step is performed to grind the back side 11b of the wafer 11. FIG. 5A is a schematic side view, partially in cross section, showing a manner of grinding the back side 11b of the wafer 11, and FIG. 5B is a schematic sectional view of the wafer 11 processed by the grinding step.

The grinding step may be performed by using a grinding apparatus 42 shown in FIG. 5A. The grinding apparatus 42 includes a holding table (chuck table) 44 for holding the wafer 11 under suction. The holding table 44 is connected to a rotational drive source (not shown) such as a motor. Accordingly, the holding table 44 is adapted to be rotated about its axis substantially parallel to a vertical direction, by operating this rotational drive source. A moving mechanism (not shown) is provided below the holding table 44, so as to move the holding table 44 in a horizontal direction. The holding table 44 has an upper surface, a part of which is formed as a holding surface 44a for holding under suction the sheet 23 fixed through the protective member 27 to the wafer 11. The holding surface 44a is connected through a suction passage (not shown) to a vacuum source (not shown), in which the suction passage is formed inside the holding table 44. Accordingly, by applying a vacuum generated from the vacuum source through the suction passage to the holding surface 44a in the condition where the sheet 23 is in contact with the holding surface 44a, the wafer 11 can be held through the sheet 23 and the protective member 27 on the holding table 44 under suction.

A grinding unit 46 is provided above the holding table 44. The grinding unit 46 includes a spindle housing (not shown) supported to an elevating mechanism (not shown). A spindle 48 is rotatably supported in the spindle housing. A disk-shaped mount 50 is fixed to the lower end of the spindle 48. A grinding wheel 52 is mounted on the lower surface of the mount 50, in which the grinding wheel 52 has substantially the same diameter as that of the mount 50. The grinding wheel 52 includes a wheel base 54 formed of metal such as stainless steel and aluminum. A plurality of abrasive members 56 are fixed to the lower surface of the wheel base 54 so as to be annularly arranged along the outer circumference of the wheel base 54. A rotational drive source (not shown) such as a motor is connected to the upper end (base end) of the spindle 48. Accordingly, the grinding wheel 52 fixed to the spindle 48 is adapted to be rotated about its axis substantially parallel to a vertical direction, by operating this rotational drive source to produce a rotational force. A nozzle (not shown) for supplying a grinding fluid such as pure water to the wafer 11 is provided inside or in the vicinity of the grinding unit 46.

In the grinding step, the wafer 11 is first held on the holding table 44 of the grinding apparatus 42 under suction. More specifically, the wafer 11 is first placed on the holding table 44a of the holding table 44 in the condition where the sheet 23 fixed through the protective member 27 to the wafer 11 is in contact with the holding surface 44a. That is, the back side 11b of the wafer 11 is exposed upward in this condition. Thereafter, the vacuum source is operated to apply a vacuum to the holding surface 44a of the holding table 44. Accordingly, the wafer 11 is held through the sheet 23 and the protective member 27 on the holding table 44 under suction in the condition where the back side 11b of the wafer 11 is exposed upward. Thereafter, the holding table 44 is moved to the position below the grinding unit 46. In this condition, both the holding table 44 and the grinding wheel 52 are rotated and the spindle housing (the spindle 48 and the grinding wheel 52) is then lowered as supplying the grinding fluid to the back side 11b of the wafer 11 as shown in FIG. 5A.

The lowering speed (feed speed) of the spindle housing is adjusted so that the lower surface of each abrasive member 56 is pressed against the back side 11b of the wafer 11 by a suitable force. Accordingly, the back side 11b of the wafer 11 can be ground by the grinding wheel 52 to thereby reduce the thickness of the wafer 11. When the thickness of the wafer 11 is reduced to a predetermined thickness (finished thickness) as shown in FIG. 5B, this grinding step is finished. While one set of grinding unit 46 is used to grind the back side 11b of the wafer 11 in this preferred embodiment, two or more sets of grinding units may be used to grind the back side 11b of the wafer 11. For example, a first set of abrasive members each containing large-sized abrasive grains may be first used to perform coarse grinding on the back side 11b of the wafer 11, and a second set of abrasive members each containing small-sized abrasive grains may be next used to perform fine grinding on the back side 11b of the wafer 11. In this case, the flatness of the back side 11b of the wafer 11 can be improved without greatly increasing the time required for grinding.

Figure 6:
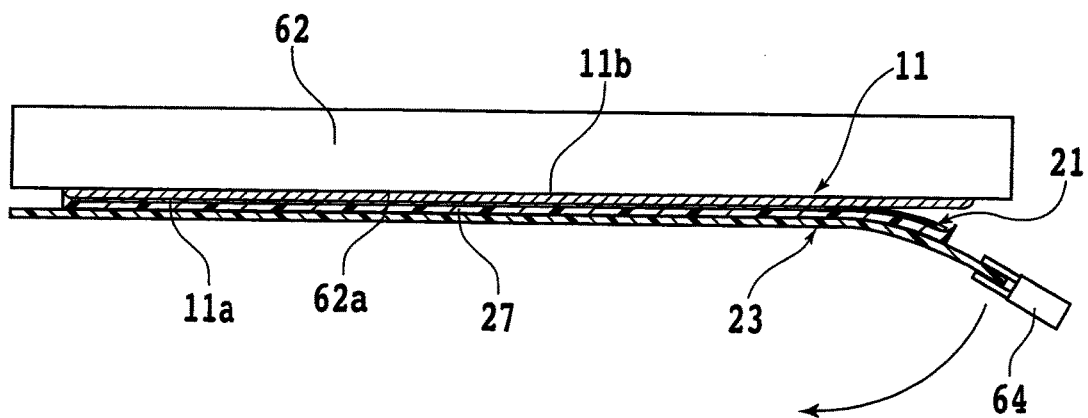
FIG. 6 is a schematic sectional view showing a manner of peeling the protective film and the protective member from the wafer in a peeling step according to this preferred embodiment.

After performing the grinding step, the peeling step is performed to peel the protective film 21 and the protective member 27 from the wafer 11 thinned by the grinding step. FIG. 6 is a schematic sectional view showing a manner of peeling the protective film 21 and the protective member 27 from the wafer 11.

In the peeling step, a wafer holding unit 62 having a holding surface 62a is used to hold the wafer 11. That is, the back side 11b of the wafer 11 is held on the holding surface 62a of the wafer holding unit 62. The wafer holding unit 62 may be of a vacuum suction type such that a vacuum is used to hold the wafer 11 on the holding surface 62a under suction or may be of an electrostatic attraction type such that an electrostatic force is used to hold the wafer 11 on the holding surface 62a. After holding the wafer 11 on the holding surface 62a of the wafer holding unit 62, a peeling unit 64 is used to peel the protective member 27 and the protective film 21. More specifically, a peripheral portion of the sheet 23 is gripped by the peeling unit 64. Thereafter, the wafer holding unit 62 and the peeling unit 64 are relatively moved so that the peripheral portion of the sheet 23 is moved away from the wafer 11 as shown in FIG. 6. Accordingly, all of the protective film 21, the protective member 27, and the sheet 23 can be peeled together from the wafer 11 as shown in FIG. 6.

In the wafer processing method according to the above preferred embodiment mentioned above, the protective film 21 is first brought into close contact with the front side 11a of the wafer 11 on which the devices 15 each having the bumps (asperities) 17 are formed in such a manner as to follow the shape of each bump 17. Thereafter, the protective film 21 is covered with the protective member 27 formed from the liquid resin 25 curable by ultraviolet light (external stimulus), thereby fixing the protective member 27 through the protective film 21 to the front side 11a of the wafer 11. Accordingly, by forming the protective member 27 having a suitable thickness, the asperities due to the bumps 17 formed on the front side 11a of the wafer 11 can be sufficiently absorbed.

In the wafer processing method according to this preferred embodiment, the protective film 21 is not bonded to the device area 11d of the wafer 11, but is merely in close contact with the device area 11d. Accordingly, the protective member 27 and the protective film 21 can be simply peeled from the wafer 11 without the need for any extensive work dedicated to peeling, such as immersion of the wafer 11 in a solution or heating of the wafer 11 at high temperatures. Thus, according to this preferred embodiment, it is possible to provide a wafer processing method which can exhibit the effects that the influence of the asperities due to the bumps 17 present on the front side 11a of the wafer 11 can be sufficiently suppressed in grinding the back side 11b of the wafer 11 and that the peeling operation after grinding can also be simply performed.

Further, in the wafer processing method according to this preferred embodiment, the protective film 21 is pressed against the front side 11a of the wafer 11 in a radially outward direction starting from the center of the wafer 11 in the close contact making step. Accordingly, it is possible to prevent that air may be left between the wafer 11 and the protective film 21, thereby reliably bringing the protective film 21 into close contact with the front side 11a of the wafer 11. As a result, although the protective film 21 does not have adhesion by an adhesive (paste), there is no possibility that the protective film 21 and the protective member 27 may be peeled from the wafer 11 in grinding the wafer 11.

The present invention is not limited to the above preferred embodiment, but various modifications may be made. For example, while the liquid resin 25 is a liquid resin curable by ultraviolet light as external stimulus in this preferred embodiment, another type of liquid resin curable by any external stimulus (e.g., heat) other than ultraviolet light may be used as the liquid resin 25.

Further, while the circular protective film 21 having a diameter substantially equal to that of the wafer 11 is used in this preferred embodiment, the diameter of the protective film 21 may be smaller than the diameter of the wafer 11. For example, the diameter of the protective film 21 may correspond to the diameter of the device area 11d of the wafer 11. In this case, the protective member 27 formed from the liquid resin 25 adheres directly to the peripheral marginal area 11e of the wafer 11. Accordingly, although the protective film 21 does not have adhesion by an adhesive (paste), the protective film 21 and the protective member 27 can be firmly fixed to the wafer 11.

Further, in this preferred embodiment, the wafer 11 is pressed through the protective film 21 against the liquid resin 25 applied to the sheet 23, thereby fixing the protective member 27 to the wafer 11. As a modification, the liquid resin 25 may be dropped onto the wafer 11 or the protective film 21 without using the sheet 23, thereby fixing the protective member 27 to the wafer 11. In this case, the exposed surface of the protective member 27 is preferably flattened by using a surface planer or the like. By flattening the exposed surface of the protective member 27 to be held on the holding table 44 in grinding the wafer 11, the back side 11b of the wafer 11 as a work surface can be ground flat in the grinding step.

Further, while the protective film 21 is softened by the heat applied from the heater 20 in the close contact making step in this preferred embodiment, softening of the protective film 21 is not essential in the close contact making step. Further, the protective film 21 may be softened by any methods other than heating by the heater 20. For example, the protective film 21 may be softened by discharging heated air (gas) toward the protective film 21.

Further, while the compressed air (gas) is discharged toward the upper surface of the protective film 21 (i.e., the second surface opposite to the first surface opposed to the wafer 11), thereby pressing the protective film 21 against the wafer 11 in this preferred embodiment, another method may be used to press the protective film 21 against the wafer 11 in the following manner. A wafer processing method according to a first modification will now be described.

Figure 7A:
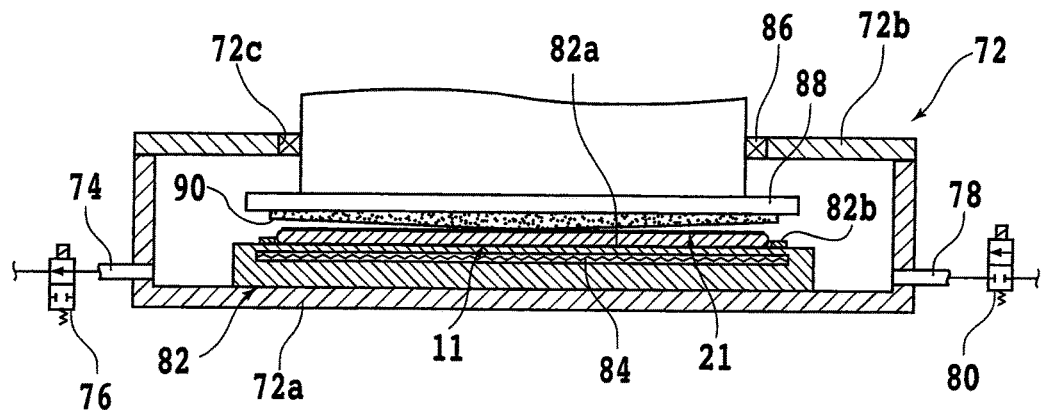
FIG. 7A is a schematic sectional view showing a condition where the protective film is opposed to the front side of the wafer in a close contact making step according to a first modification.
Figure 7B:
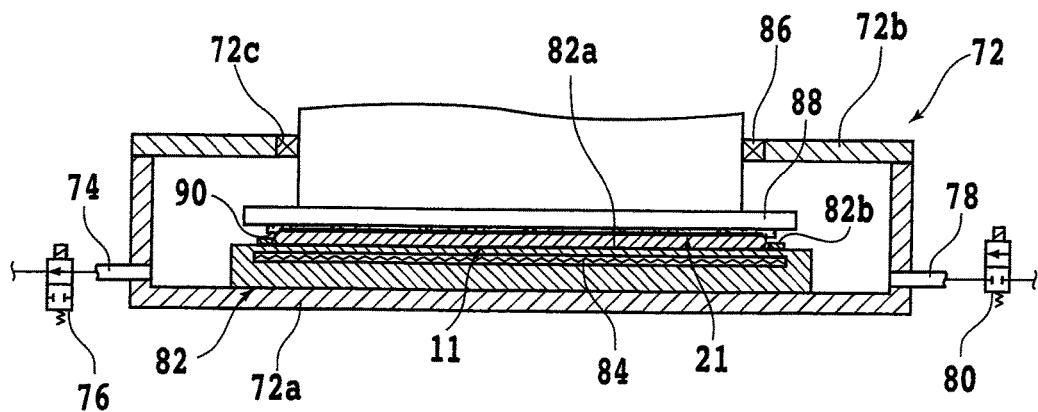
FIG. 7B is a schematic sectional view showing a manner of bringing the protective film into close contact with the front side of the wafer in the close contact making step according to the first modification.

FIG. 7A is a schematic sectional view showing a close contact making step in the wafer processing method according to the first modification, in which the protective film 21 is opposed to the front side 11a of the wafer 11. FIG. 7B is a schematic sectional view similar to FIG. 7A, showing a manner of bringing the protective film 21 into close contact with the front side 11a of the wafer 11.

The close contact making step according to the first modification may be performed by using a vacuum chamber 72 shown in FIG. 7A. The vacuum chamber 72 includes a casing member 72a having an upper opening having a size allowing the pass of the wafer 11 and a door member 72b for closing the upper opening of the casing member 72a. The casing member 72a is connected through an outlet pipe 74 and a valve 76 to a vacuum source (not shown). The casing member 72a is also connected to an inlet pipe 78 and a valve 80 for introducing the outside air (atmospheric air) into the vacuum chamber 72.

A support table 82 for supporting the wafer 11 is provided in the casing member 72a. The support table 82 has a substantially flat upper surface, which functions as a support surface 82a for supporting the wafer 11. The support surface 82a is provided with a projecting guide portion 82b for positioning the wafer 11 on the support surface 82a. A heater 84 for heating the support surface 82a is provided inside the support table 82.

The door member 72b is formed with a vertically extending through hole 72c. A pressing unit 88 is inserted through the through hole 72c with a hermetic bearing 86 interposed therebetween, so that the pressing unit 88 is vertically movably supported to the door member 72b by the hermetic bearing 86. The pressing unit 88 has a substantially flat lower surface larger in diameter than the wafer 11. A cushion member 90 such as a sponge is provided on the lower surface of the pressing unit 88. The cushion member 90 is larger in diameter than the wafer 11. The cushion member 90 has a thickness gradually increasing from the outer circumference to the center in the radial direction.

In the close contact making step according to the first modification, the wafer 11 is loaded into the vacuum chamber 72 through the upper opening of the casing member 72a and then placed on the support table 82 in the condition where the back side 11b of the wafer 11 is in contact with the support surface 82a of the support table 82. Accordingly, the wafer 11 is supported on the support table 82 in the condition where the front side 11a of the wafer 11 is exposed upward. Thereafter, the protective film 21 is placed on the front side 11a of the wafer 11. That is, the protective film 21 is opposed to the front side 11a of the wafer 11. As a modification, the protective film 21 may be first opposed to the front side 11a of the wafer 11, and the wafer 11 is next placed on the support table 82.

Thereafter, the door member 72b is closed to cover the upper opening of the casing member 72a, and the valve 80 is closed. Thereafter, the valve 76 is opened to thereby evacuate the inside space of the vacuum chamber 72. Thereafter, the pressing unit 88 is gradually lowered until the center of the cushion member 90 comes into contact with the upper surface of the protective film 21 as shown in FIG. 7A. Thereafter, the pressing unit 88 is further lowered to thereby press the cushion member 90 against the protective film 21. As a result, the protective film 21 is pressed against the front side 11a of the wafer 11 in a radially outward direction starting from the center of the wafer 11. The lowering of the pressing unit 88 is continued until the whole of the protective film 21 is pressed against the wafer 11. After the whole of the protective film 21 is pressed against the wafer 11, the valve 76 is closed and the valve 80 is next opened to thereby introduce the outside air (atmospheric air) into the vacuum chamber 72. As a result, an atmospheric pressure acts on the protective film 21 to thereby bring the protective film 21 into close contact with the front side 11a of the wafer 11 so as to follow the shape of each bump 17 formed on the front side 11a of the wafer 11. In pressing the protective film 21 against the wafer 11, the heater 84 is preferably operated to heat the protective film 21, thereby softening the protective film 21. In this case, the protective film 21 can be brought into close contact with the wafer 11 more easily.

Also in the wafer processing method according to the first modification, the protective film 21 is pressed against the front side 11a of the wafer 11 in a radially outward direction starting from the center of the wafer 11 in the close contact making step. Accordingly, it is possible to prevent that air may be left between the wafer 11 and the protective film 21, so that the protective film 21 can be reliably brought into close contact with the wafer 11. As a result, although the protective film 21 does not have adhesion by an adhesive (paste), there is no possibility that the protective film 21 and the protective member 27 may be peeled from the wafer 11 in grinding the wafer 11.

A wafer processing method according to a second modification will now be described. In the wafer processing method according to the second modification, a liquid supplying step for supplying a liquid 29 to the front side 11a of the wafer 11 is performed before performing the close contact making step (see FIG. 8A). The liquid 29 (see FIG. 8A) to be supplied to the wafer 11 is not especially limited in kind, but it is desirable to use a liquid hard to vaporize at room temperature (20° C.) and having a boiling point not so high (e.g., 100° C. or less). For example, water may be used as the liquid 29. In this modification, the liquid 29 is supplied to the center of the front side 11a of the wafer 11.

Figure 8A:
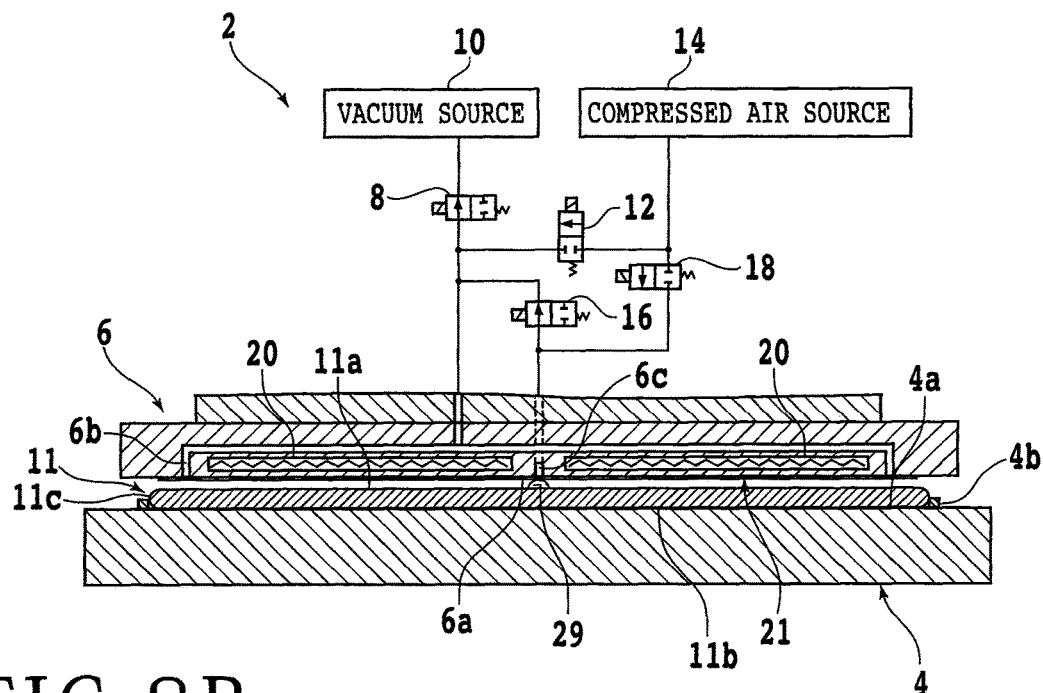
FIG. 8A is a schematic sectional view showing a condition where the protective film is opposed to the front side of the wafer in a close contact making step according to a second modification.
Figure 8B:
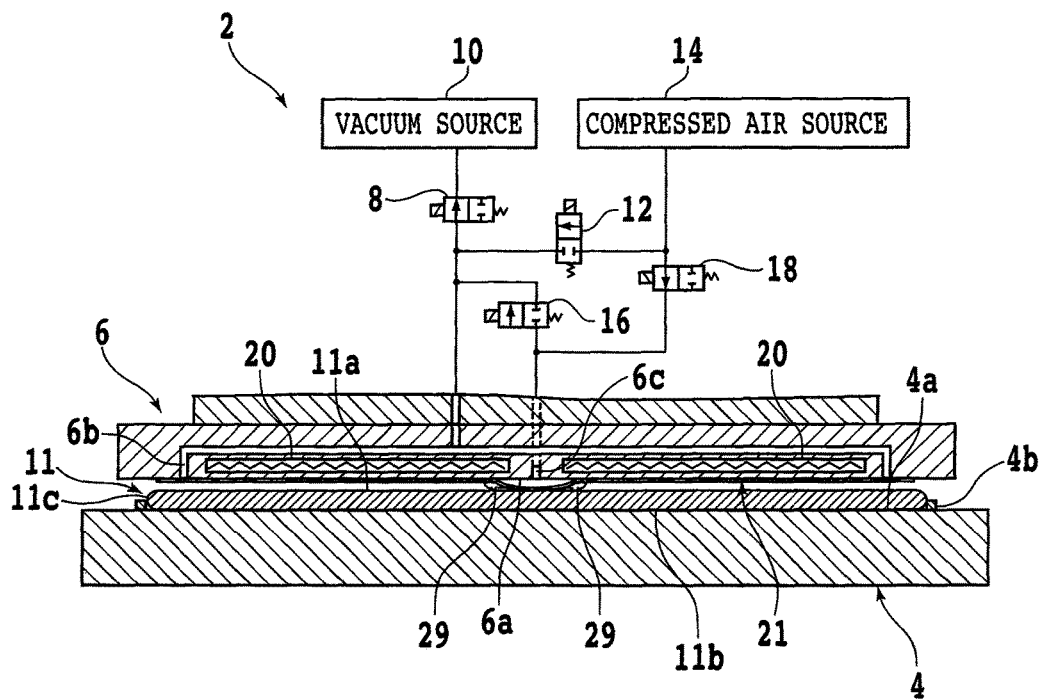
FIG. 8B is a schematic sectional view showing a manner of bringing the protective film into close contact with the front side of the wafer in the close contact making step according to the second modification.
Figure 9A:
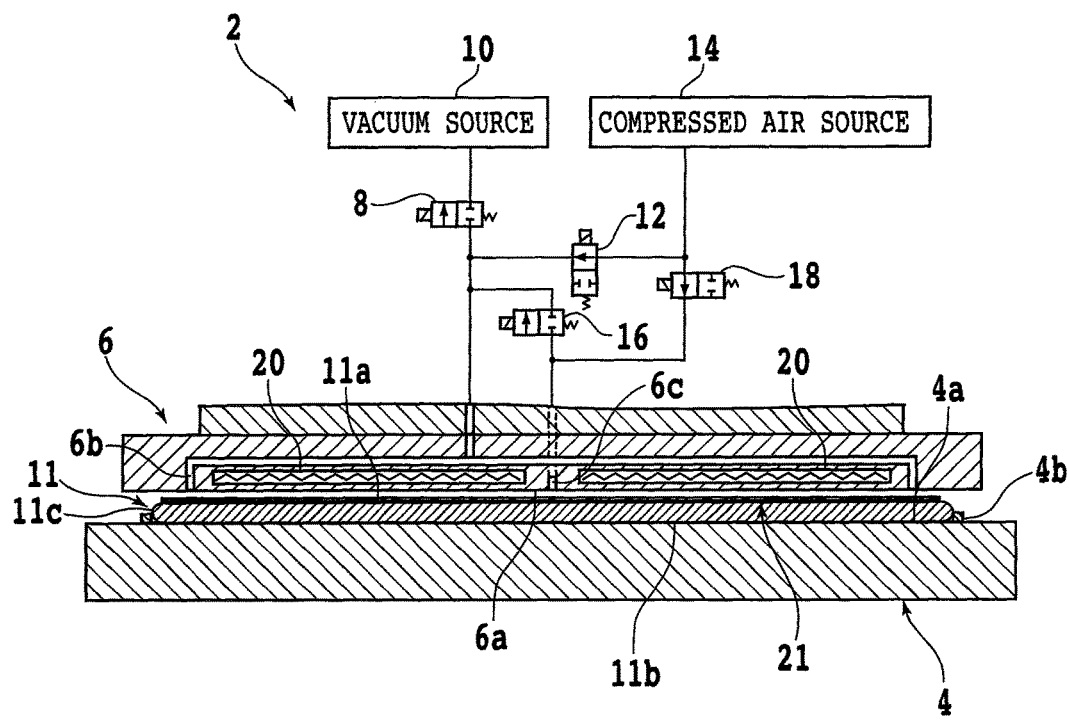
FIG. 9A is a schematic sectional view showing a condition where the protective film has been brought into close contact with the front side of the wafer in the close contact making step according to the second modification.
Figure 9B:
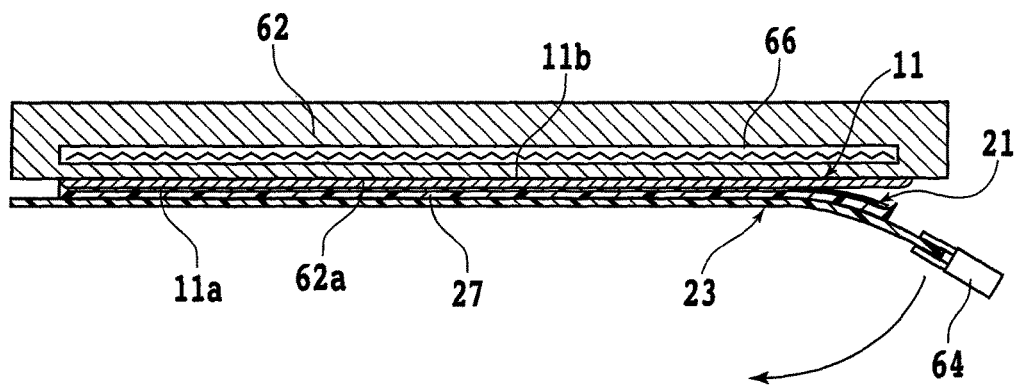
FIG. 9B is a schematic sectional view showing a manner of peeling the protective film and the protective member from the wafer in a peeling step according to the second modification.

After performing the liquid supplying step, the close contact making step is performed. FIG. 8A is a schematic sectional view showing a condition where the protective film 21 is opposed to the front side 11a of the wafer 11 in the close contact making step in the wafer processing method according to the second modification, and FIG. 8B is a schematic sectional view showing a manner of bringing the protective film 21 into close contact with the front side 11a of the wafer 11 in the second modification. FIG. 9A is a schematic sectional view showing a condition where the protective film 21 has been brought into close contact with the front side 11a of the wafer 11 in the second modification. FIG. 9B is a schematic sectional view showing a manner of peeling the protective film 21 and the protective member 27 from the wafer 11 in the peeling step in the wafer processing method according to the second modification. In FIGS. 8A, 8B, and 9A, a part of the components is shown by functional blocks.

The close contact making step according to the second modification may be performed by using a close contact making apparatus 2 shown in FIG. 8A. The configuration of the close contact making apparatus 2 shown in FIG. 8A is the same as that of the close contact making apparatus 2 shown in FIG. 2A. In the close contact making step according to the second modification, the wafer 11 is first placed on the support table 4 in the condition where the back side 11b of the wafer 11 is in contact with the support surface 4a of the support table 4 as shown in FIG. 8A. Accordingly, the wafer 11 is supported on the support table 4 in the condition where the front side 11a of the wafer 11 is exposed upward. Thereafter, the protective film 21 is brought into contact with the holding surface 6a of the protective film holding unit 6 so as to be aligned with the wafer 11. More specifically, the outer circumference of the protective film 21 is positioned directly above the outer circumference 11c of the wafer 11.

Thereafter, the valves 8 and 16 are opened to apply a vacuum generated from the vacuum source 10 to the protective film 21. Accordingly, the protective film 21 is held on the holding surface 6a of the protective film holding unit 6 under suction so as to be opposed to the front side 11a of the wafer 11. Before opening the valves 8 and 16, the valves 12 and 18 are closed to stop the supply of compressed air (gas) from the compressed air source 14 to the first passage 6b and the second passage 6c. After opposing the protective film 21 to the front side 11a of the wafer 11, the holding surface 6a is heated by the heater 20 to thereby apply heat to the protective film 21, thereby softening the protective film 21.

Thereafter, as shown in FIG. 8B, the valve 16 is closed to cut off the vacuum from the vacuum source 10 to the second passage 6c, and the valve 18 is next opened to supply the compressed air from the compressed air source 14 to the second passage 6c.

Accordingly, the compressed air is discharged toward the central portion of the upper surface of the protective film 21, in which the central portion of the upper surface of the protective film 21 is merely in contact with the holding surface 6a at this time (the upper surface of the protective film 21 corresponds to the second surface opposite to the first surface of the protective film 21 opposed to the wafer 11). As a result, the central portion of the protective film 21 is swelled downward and pressed against the front side 11a of the wafer 11 as shown in FIG. 8B. In this second modification, the liquid 29 is previously supplied to the central portion of the front side 11a of the wafer 11 in the liquid supplying step as mentioned above, so that the protective film 21 is pressed against the front side 11a of the wafer 11 with a film of the liquid 29 interposed therebetween. Thereafter, the discharge of the compressed air toward the protective film 21 is continued, so that the protective film 21 is pressed against the front side 11a of the wafer 11 in a radially outward direction starting from the center of the wafer 11. After pressing the protective film 21 against the front side 11a of the wafer 11 in the whole area except the peripheral area yet held under suction, the valve 8 is closed to cut off the vacuum from the vacuum source 10 to the first passage 6b, and the valve 12 is next opened to supply the compressed air from the compressed air source 14 to the first passage 6b as shown in FIG. 9A. Accordingly, the compressed air is also discharged toward the peripheral portion of the upper surface of the protective film 21, so that the peripheral portion of the protective film 21 is also pressed against the front side 11a of the wafer 11.

As a result, the protective film 21 can be brought into close contact with the front side 11a of the wafer 11 so as to follow the shape of each bump 17 formed on the front side 11a of the wafer 11. Further, the protective film 21 is heated to be softened by the heater 20, so that the protective film 21 can be brought into close contact with the front side 11a of the wafer 11 so as to be properly fitted to each bump 17. In this second modification, when the protective film 21 is pressed against the front side 11a of the wafer 11, the liquid 29 is moved by the protective film 21 to push out the air left between the protective film 21 and the front side 11a of the wafer 11. Accordingly, the protective film 21 can be reliably brought into close contact with the front side 11a of the wafer 11. In this second modification, a film of the liquid 29 is left between the protective film 21 and the wafer 11. That is, the protective film 21 is brought into close contact with the front side 11a of the wafer 11 with a film of the liquid 29 interposed therebetween.

After performing the close contact making step, the protective member fixing step, and the grinding step are sequentially performed in a manner similar to that of the above preferred embodiment. After performing the grinding step, a peeling step according to the second modification is performed. In the peeling step, the back side 11b of the wafer 11 is held on the holding surface 62a of the wafer holding unit 62 as shown in FIG. 9B. The wafer holding unit 62 may be of a vacuum suction type such that a vacuum is used to hold the wafer 11 on the holding surface 62a under suction or may be of an electrostatic attraction type such that an electrostatic force is used to hold the wafer 11 on the holding surface 62a. In this second modification, a heater 66 is preferably provided inside the wafer holding unit 62 as shown in FIG. 9B.

After holding the wafer 11 on the holding surface 62a of the wafer holding unit 62, a peripheral portion of the sheet 23 is gripped by the peeling unit 64. Thereafter, the wafer holding unit 62 and the peeling unit 64 are relatively moved so that the peripheral portion of the sheet 23 is moved away from the wafer 11 as shown in FIG. 9B. At this time, the heater 66 is preferably operated to heat the liquid 29 left between the protective film 21 and the wafer 11, thereby vaporizing the liquid 29. Thus, all of the protective film 21, the protective member 27, and the sheet 23 can be peeled together from the wafer 11 as shown in FIG. 9B.

Also in the wafer processing method according to the second modification, the protective film 21 is pressed against the front side 11a of the wafer 11 in a radially outward direction starting from the center of the wafer 11 in the close contact making step. Accordingly, it is possible to prevent that air may be left between the wafer 11 and the protective film 21, thereby reliably bringing the protective film 21 into close contact with the front side 11a of the wafer 11. As a result, although the protective film 21 does not have adhesion by an adhesive (paste), there is no possibility that the protective film 21 and the protective member 27 may be peeled from the wafer 11 in grinding the wafer 11. Further, in the second modification, the liquid 29 is left between the protective film 21 and the wafer 11 in the close contact making step. Accordingly, by heating the liquid 29 to vaporize it in the peeling step, the protective film 21 can be easily peeled from the wafer 11.

Figure 10:
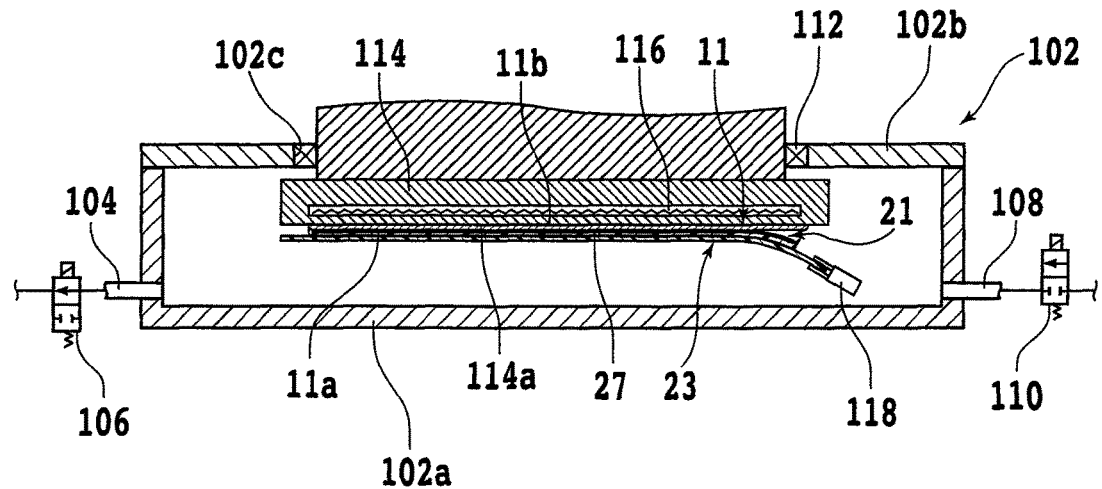
FIG. 10 is a schematic sectional view showing a manner of peeling the protective film and the protective member from the wafer in a peeling step according to a third modification.

A wafer processing method according to a third modification will now be described. The wafer processing method according to the third modification is performed in a manner similar to that of the above preferred embodiment and the second modification. That is, the liquid supplying step, the close contact making step, the protective member fixing step, and the grinding step are similarly performed in this order. After performing the grinding step, a peeling step according to the third modification is performed. FIG. 10 is a schematic sectional view showing a manner of peeling the protective film 21 and the protective member 27 from the wafer 11 in the peeling step in the wafer processing method according to the third modification.

The peeling step according to the third modification may be performed by using a vacuum chamber 102 shown in FIG. 10. The vacuum chamber 102 includes a casing member 102a having an upper opening having a size allowing the pass of the wafer 11 and a door member 102b for closing the upper opening of the casing member 102a. The casing member 102a is connected through an outlet pipe 104 and a valve 106 to a vacuum source (not shown). The casing member 102a is also connected to an inlet pipe 108 and a valve 110 for introducing the outside air (atmospheric air) into the vacuum chamber 102. The door member 102b is formed with a vertically extending through hole 102c. A wafer holding unit 114 is inserted through the through hole 102c with a hermetic bearing 112 interposed therebetween, so that the wafer holding unit 114 is vertically movably supported to the door member 102b by the hermetic bearing 112. The wafer holding unit 114 has a substantially flat lower surface 114a as a holding surface larger in diameter than the wafer 11.

The wafer holding unit 114 may be of an electrostatic attraction type such that an electrostatic force is used to hold the wafer 11 on the lower surface 114a. Further, a heater 116 is provided inside the wafer holding unit 114. A peeling unit 118 is provided in the vicinity of the wafer holding unit 114.

In the peeling step according to the third modification, the back side 11b of the wafer 11 is held on the lower surface 114a of the wafer holding unit 114. Thereafter, the door member 102b is closed to cover the upper opening of the casing member 102a, and the valve 110 is closed. Thereafter, the valve 106 is opened to thereby evacuate the inside space of the vacuum chamber 102. Thereafter, a peripheral portion of the sheet 23 is gripped by the peeling unit 118, and the wafer holding unit 114 and the peeling unit 118 are relatively moved so that the peripheral portion of the sheet 23 is moved away from the wafer 11. At this time, the heater 116 may be operated to heat the liquid 29 left between the protective film 21 and the wafer 11, thereby vaporizing the liquid 29. Thus, all of the protective film 21, the protective member 27, and the sheet 23 can be peeled together from the wafer 11 as shown in FIG. 10.

In the wafer processing method according to the third modification, the protective film 21 is peeled from the wafer 11 under vacuum. Accordingly, the liquid 29 left between the protective film 21 and the wafer 11 is vaporized in the peeling step, so that the protective film 21 can be easily peeled.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method comprising:
   a close contact making step of opposing a protective film to the front side of a wafer on which a central device area and a peripheral marginal area surrounding said device area are formed, a plurality of devices each having asperities being formed in said device area, and next pressing said protective film against the front side of said wafer in a radially outward direction starting from the center of said wafer to thereby bring said protective film into close contact with the front side of said wafer so as to follow said asperities of each device formed on the front side of said wafer;
   a protective member fixing step of covering said protective film with a protective member formed from a liquid resin curable by external stimulus after performing said close contact making step, thereby fixing said protective member through said protective film to the front side of said wafer;
   a grinding step of holding said protective member fixed to said wafer on a holding surface of a chuck table in the condition where the back side of said wafer is exposed after performing said protective member fixing step, and next grinding the back side of said wafer to thereby reduce the thickness of said wafer; and
   a peeling step of peeling said protective member and said protective film from said wafer after performing said grinding step.

2. The wafer processing method according to claim 1, wherein said protective film has a first surface and a second surface opposite to said first surface, said first surface being opposed to said wafer;
   said close contact making step including the step of discharging a gas toward said second surface of said protective film to thereby press said protective film against the front side of said wafer.

3. The wafer processing method according to claim 2, wherein said gas includes a heated gas.

4. The wafer processing method according to claim 1, wherein said close contact making step includes the step of heating said protective film to thereby soften said protective film in pressing said protective film against the front side of said wafer.

5. The wafer processing method according to claim 1, wherein said protective member fixing step includes the steps of applying said liquid resin to a flat sheet, next pressing said wafer against said liquid resin through said protective film to thereby fully cover said protective film with said liquid resin, and next applying said external stimulus to said liquid resin to thereby cure said liquid resin, thereby forming said protective member from said liquid resin and fixing said protective member to said wafer.

6. The wafer processing method according to claim 1, wherein said close contact making step includes the steps of pressing said protective film against the front side of said wafer under vacuum and next applying an atmospheric pressure to said protective film to thereby bring said protective film into close contact with the front side of said wafer so as to follow said asperities.

7. The wafer processing method according to claim 1, further comprising:
  a liquid supplying step of supplying a liquid to the front side of said wafer before performing said close contact making step;
  said close contact making step including the step of pressing said protective film against the front side of said wafer with said liquid interposed therebetween.

8. The wafer processing method according to claim 7, wherein said peeling step includes the step of vaporizing said liquid left between said protective film and the front side of said wafer.

* * * * *